United States Patent
Ogawa et al.

(10) Patent No.: US 9,832,871 B2
(45) Date of Patent: Nov. 28, 2017

(54) MODULE

(71) Applicant: Murata Manufacturing Co., Ltd., Kyoto (JP)

(72) Inventors: Nobuaki Ogawa, Kyoto (JP); Tadashi Nomura, Kyoto (JP)

(73) Assignee: MURATA MANUFACTURING CO, LTD., Kyoto (JP)

( * ) Notice: Subject to any disclaimer, the term of this patent is extended or adjusted under 35 U.S.C. 154(b) by 0 days.

(21) Appl. No.: 14/943,245

(22) Filed: Nov. 17, 2015

(65) Prior Publication Data

US 2016/0073499 A1 Mar. 10, 2016

Related U.S. Application Data

(63) Continuation of application No. PCT/JP2014/056192, filed on Mar. 10, 2014.

(30) Foreign Application Priority Data

May 21, 2013 (JP) .................................. 2013-107346

(51) Int. Cl.
*H05K 1/11* (2006.01)
*H05K 3/28* (2006.01)
(Continued)

(52) U.S. Cl.
CPC .............. *H05K 1/111* (2013.01); *H01L 23/31* (2013.01); *H01L 23/3121* (2013.01);
(Continued)

(58) Field of Classification Search
CPC ............................. H05K 1/056; H05K 1/115
See application file for complete search history.

(56) References Cited

U.S. PATENT DOCUMENTS

| | | |
|---|---|---|
| 2002/0094604 A1 | 7/2002 | Hayama |
| 2003/0178229 A1 | 9/2003 | Toyoda |

(Continued)

FOREIGN PATENT DOCUMENTS

| | | |
|---|---|---|
| JP | H11-121645 A | 4/1999 |
| JP | 2001-217346 A | 8/2001 |

(Continued)

OTHER PUBLICATIONS

International Search Report issued in Application No. PCT/JP2014/056192 dated Apr. 8, 2014.
(Continued)

*Primary Examiner* — Jeremy C Norris
(74) *Attorney, Agent, or Firm* — Pearne & Gordon LLP

(57) ABSTRACT

A module having high reliability in terms of its connection to an external unit is provided. The module includes: a wiring substrate that mounts components and 3b thereon; a substrate electrode formed on one main surface of the wiring substrate; a columnar conductor connected at one end to the substrate electrode; an intermediate coating formed to cover an outer peripheral surface of the columnar conductor; and a first sealing resin layer provided to cover one main surface of the wiring substrate and the intermediate coating. The intermediate coating has a coefficient of linear expansion which is between that of the columnar conductor and that of the first sealing resin layer.

22 Claims, 9 Drawing Sheets

(51) Int. Cl.
*H05K 3/40* (2006.01)
*H01L 23/498* (2006.01)
*H01L 23/31* (2006.01)
*H05K 1/18* (2006.01)
*H01L 23/538* (2006.01)

(52) U.S. Cl.
CPC .. *H01L 23/49811* (2013.01); *H01L 23/49827* (2013.01); *H05K 1/115* (2013.01); *H05K 1/181* (2013.01); *H05K 3/284* (2013.01); *H05K 3/4007* (2013.01); *H01L 23/5389* (2013.01); *H01L 2224/16238* (2013.01); *H01L 2224/81191* (2013.01); *H01L 2224/81444* (2013.01); *H01L 2924/1531* (2013.01); *H01L 2924/19106* (2013.01); *H05K 2201/0367* (2013.01); *H05K 2201/068* (2013.01); *H05K 2203/025* (2013.01); *H05K 2203/0588* (2013.01)

(56) References Cited

U.S. PATENT DOCUMENTS

| | | |
|---|---|---|
| 2006/0038288 A1 | 2/2006 | Yoshioka et al. |
| 2008/0180926 A1 | 7/2008 | Sakai |
| 2009/0152742 A1* | 6/2009 | Ikeguchi ................ H05K 1/144 257/778 |

FOREIGN PATENT DOCUMENTS

| | | |
|---|---|---|
| JP | 2003-023253 A | 1/2003 |
| JP | 2005-159268 A | 6/2005 |
| JP | 2006-012870 A | 1/2006 |
| JP | 2006-060119 A | 3/2006 |
| JP | 2012-138628 A | 7/2012 |
| WO | 2006/051821 A1 | 5/2006 |
| WO | 2007/046197 A1 | 4/2007 |
| WO | 2013/035717 A1 | 3/2013 |

OTHER PUBLICATIONS

Translation of Written Opinion issued in Application No. PCT/JP2014/056192 dated Apr. 8, 2014.

Japanese Office Action issued in Patent Application No. 2015-518125 dated Nov. 29, 2016.

* cited by examiner

MODULE

BACKGROUND

Technical Field

The present disclosure relates to a module in which external-connection columnar conductors connected to a wiring substrate are sealed with resin.

Hitherto, there is a module to be connected to an external unit by using columnar conductors connected to a wiring substrate. For example, a module 100 shown in FIG. 11 disclosed in Patent Document 1 includes: a wiring substrate 101; a plurality of substrate electrodes 102 formed on one main surface of the wiring substrate 101; a plurality of external-connection columnar conductors 103 which are disposed for the respective substrate electrodes 102 and each of which is connected at one end to the associated substrate electrode 102; a sealing resin layer 104 which covers one main surface of the wiring substrate 101 and the columnar conductors 103; and a plurality of outer electrodes 105 which are disposed on the surface of the sealing resin layer 104 and which are connected to the other ends of the associated columnar conductors 103. By connecting the outer electrodes 105 to an external unit, for example, a motherboard, the module 100 is connected to the external unit. With this configuration, components may be mounted on both main surfaces of the wiring substrate 101, and the wiring structure of the module 100 may be formed in a three-dimensional structure, thereby making it possible to reduce the size of the module 100.

Patent Document 1: Japanese Unexamined Patent Application Publication No. 2006-12870 (see, for example, paragraphs 0010 to 0028 and FIG. 1)

SUMMARY OF INVENTION

Technical Problem

However, concerning the structure of the module 100 of the related art, if the sealing resin layer 104 expands or contracts due to a temperature change, stress is applied to the columnar conductors 103. Then, separation occurs at connecting portions between the columnar conductors 103 and the wiring substrate 101, and more specifically, at the interface between the substrate electrodes 102 and the columnar conductors 103 and between the wiring substrate 101 and the substrate electrodes 102. This causes connection faults. Moreover, the coefficient of linear expansion of the sealing resin layer 104 and that of the columnar conductors 103 are different. Accordingly, because of the difference in the degree of expansion and contraction between the sealing resin layer 104 and the columnar conductors 103, stress may be produced. In this state, if the temperature of the module 100 is changed, separation may occur at the interface between the sealing resin layer 104 and the columnar conductors 103. In this case, the stress applied to the columnar conductors 103 due to the expansion and contraction of the sealing resin layer 104 is concentrated on the connecting portions between the wiring substrate 101 and the columnar conductors 103. Because of this reason, separation is likely to occur at the interface between the substrate electrodes 102 and the columnar conductors 103 and between the wiring substrate 101 and the substrate electrodes 102. Additionally, if separation occurs between the columnar conductors 103 and the sealing resin layer 104, when the module 100 is mounted on an external unit, such as a motherboard, stress applied to the columnar conductors 103 is concentrated on the connecting portions between the wiring substrate 101 and the columnar conductors 103 due to the difference in the coefficients of linear expansion between the motherboard and the sealing resin layer 104 of the module 100. Because of this reason, too, separation may occur at the interface between the substrate electrodes 102 and the columnar conductors 103 and between the wiring substrate 101 and the substrate electrodes 102.

At the connecting portions between the wiring substrate 101 and the columnar conductors 103, the columnar conductors 103, which are made of metal, and the substrate electrodes 102, which are made of metal, are connected to each other. In contrast, concerning the connection between the wiring substrate 101 and the substrate electrodes 102, if the wiring substrate 101 is made of a ceramic or glass epoxy resin, the substrate electrodes 102, which are made of metal, and the wiring substrate 101, which is made of a material different from metal, are connected. Accordingly, the adhesion strength between the wiring substrate 101 and the substrate electrodes 102 is smaller than that between the columnar conductors 103 and the substrate electrodes 102. Thus, if stress is applied to the columnar conductors 103, separation is likely to occur at the interface between the wiring substrate 101 and the substrate electrodes 102 at the connecting portions between the wiring substrate 101 and the columnar conductors 103. For handling such a situation, the contact area between the substrate electrodes 102 and the wiring substrate 101 may be increased by enlarging the area of the substrate electrodes 102 as viewed from above, so that the adhesion strength between the wiring substrate 101 and the substrate electrodes 102 can be enhanced. However, in accordance with a recent trend of smaller sizes of modules, there is also a demand for decreasing the size and the pitch of the substrate electrodes 102. Thus, there is a limitation on increasing the size of the substrate electrodes 102.

The present disclosure has been made in view of the above-described problem. The present disclosure provides a module having high reliability in terms of its connection to an external unit.

A module of the present disclosure includes: a wiring substrate that mounts a component thereon; a substrate electrode that is formed on one main surface of the wiring substrate; a columnar conductor that is connected at one end to the substrate electrode; an intermediate coating that is formed to cover an outer peripheral surface of the columnar conductor; and a sealing resin layer that is provided to cover one main surface of the wiring substrate and the intermediate coating. The intermediate coating has a coefficient of linear expansion which is between a coefficient of linear expansion of the columnar conductor and a coefficient of linear expansion of the sealing resin layer.

With this configuration, the intermediate coating is interposed between the sealing resin layer and the columnar conductor. For example, when the module is mounted on, for example, an external motherboard, stress may be applied to the columnar conductor due to the difference in the coefficient of linear expansion (difference in the degree of expansion and contraction) between the motherboard and the sealing resin layer of the module. Even in this case, the intermediate coating serves as a stress relaxing member so as to relax the stress applied to the columnar conductor. It is thus possible to prevent the occurrence of separation at the connecting portion between the columnar conductor and the wiring substrate, which may be caused by the stress applied to the columnar conductor, that is, at the interface between the wiring substrate and the substrate electrode and at the interface between the substrate electrode and the columnar conductor. Moreover, the coefficient of linear expansion of the intermediate coating is a value between that of the columnar conductor and that of the sealing resin layer. Accordingly, the difference in the coefficient of linear expansion between the columnar conductor and the intermediate coating and that between the intermediate coating and the sealing resin layer are smaller. Accordingly, compared with a module in which a columnar conductor is sealed with a sealing resin layer without necessarily an intermediate coating there between, it is possible to reduce the application of stress to the interface between the columnar conductor and the intermediate coating and the interface between the intermediate coating and the sealing resin layer, which may be caused by the difference in the degree of expansion and contraction due to a temperature change. Thus, it is less likely that interface separation will occur between the columnar conductor and the intermediate coating and between the intermediate coating and the sealing resin layer. As a result, the side surfaces of the columnar conductor are supported by the sealing resin layer by the provision of the intermediate coating.

When a module is mounted on, for example, a motherboard, stress may be applied to a columnar conductor due to the difference in the coefficient of linear expansion (difference in the degree of expansion and contraction) between the motherboard and a sealing resin layer of the module. In this case, if the side surfaces of the columnar conductor are separated from the sealing resin layer and are not supported by it, the stress is concentrated on the connecting portion between the columnar conductor and a wiring substrate. On the other hand, if the side surfaces of the columnar conductor are supported by the sealing resin layer, stress is also distributed over the interface between the columnar conductor and the intermediate coating. Accordingly, it is possible to prevent the concentration of stress applied to the columnar conductor on the connecting portion between the columnar conductor and the wiring substrate, which may be caused by the interface separation between the columnar conductor and the sealing resin layer observed in a module. Thus, it is possible to prevent the occurrence of interface separation between the wiring substrate and the substrate electrode and between the substrate electrode and the columnar conductor. As a result, a module having high reliability in terms of its connection to an external unit can be provided.

The columnar conductor may be located such that a center point of a connecting surface of the columnar conductor which is connected to the substrate electrode is displaced in a predetermined direction from a center point of a connecting surface of the substrate electrode which is connected to the columnar conductor. When stress is applied to the columnar conductor, the location of the connecting portion between the wiring substrate and the columnar conductor where the stress becomes most intensified is the connecting surface (end surface at one end) of the columnar conductor which is connected to and opposes the substrate electrode, in particular, the peripheral edge of this connecting surface. Concerning the connection between the substrate electrode and the columnar conductor, the substrate electrode, which is made of metal, and the columnar conductor, which is made of metal, are connected to each other. In contrast, concerning the connection between the wiring substrate and the substrate electrode, the substrate electrode, which is made of metal, and the wiring substrate, which is made of a material different from metal, are connected. Accordingly, the adhesion strength between the wiring substrate and the substrate electrode is smaller than that between the columnar conductor and the substrate electrode. Thus, if the peripheral edge of the end surface at one end of the columnar conductor is close to the peripheral edge of a contact portion between the wiring substrate and the substrate electrode from which the occurrence of interface separation may start, strong stress is applied, which may cause separation at the interface between the wiring substrate and the substrate electrode. Then, the center point of the connecting surface of the columnar conductor to be connected to the substrate electrode is displaced from the center point of the connecting surface of the substrate electrode to be connected to the columnar conductor, so that the peripheral edge of the contact portion between the wiring substrate and the substrate electrode can be separated from the peripheral edge of the connecting surface of the columnar conductor to be connected to the substrate electrode. With this configuration, the peripheral edge of the contact portion between the wiring substrate and the substrate electrode where separation is likely to occur can be separated from the location where stress is intensified, thereby preventing the occurrence of interface separation between the wiring substrate and the substrate electrode. As a result, the reliability of the module in terms of its connection to an external unit is further enhanced.

In a case in which a coefficient of linear expansion of a motherboard to which the other end of the columnar conductor is connected is greater than the coefficient of linear expansion of the sealing resin layer, the predetermined direction may be a direction toward a center of one main surface of the wiring substrate. When the module is connected to an external motherboard, if the coefficient of linear expansion of the motherboard is different from that of the sealing resin layer of the module, stress is applied to the columnar conductor caused by the difference in the degree of expansion and contraction between the sealing resin layer and the motherboard due to a temperature change. In this case, when the temperature is increased, the members forming the module soften, so that the connecting portion between the columnar conductor and the wiring substrate is not significantly influenced. In contrast, when the temperature is decreased, stress applied to the columnar conductor causes a problem.

In a case in which the coefficient of linear expansion of the motherboard is greater than that of the sealing resin layer, the direction of a shear stress applied to the connecting portion between the wiring substrate and the columnar conductor when the temperature is decreased is a direction toward the center of one main surface of the wiring substrate to which one end of the columnar conductor is connected. In this case, the area where the shearing stress becomes most intensified is toward the peripheral edge of one main surface of the wiring substrate in the area of the peripheral edge of the end surface at one end of the columnar conductor. Therefore, in a case in which the coefficient of linear expansion of the motherboard is greater than that of the sealing resin layer, the center point of the connecting surface of the columnar conductor to be connected to the substrate electrode is displaced in a direction toward the center of one main surface of the wiring substrate from the center point of the connecting surface of the substrate electrode to be connected to the columnar conductor. With this arrangement, the peripheral edge of a contact portion between the wiring substrate and the substrate electrode from which the occurrence of interface separation may start can be separated from the direction toward the peripheral edge of one main surface of the wiring substrate in the area of the peripheral edge of the end surface at one end of the columnar conductor where a shearing stress applied to the connecting portion between the wiring substrate and the columnar conductor becomes most intensified. It is thus possible to prevent the occurrence of interface separation between the wiring substrate and the substrate electrode, which may be caused by stress applied to the columnar conductor.

In a case in which the coefficient of linear expansion of a motherboard to which the other end of the columnar conductor is connected is smaller than the coefficient of linear expansion of the sealing resin layer, the predetermined direction may be a direction toward a peripheral edge of one main surface of the wiring substrate. In this case, the direction of a shearing stress applied to the connecting portion between the wiring substrate and the columnar conductor is the direction toward the peripheral edge of one main surface of the wiring substrate, which is opposite from the direction in a case in which the coefficient of linear expansion of the motherboard is greater than that of the sealing resin layer. In this case, the area where the shearing stress becomes most intensified is toward the center of one main surface of the wiring substrate in the area of the peripheral edge of the end surface at one end of the columnar conductor. Therefore, in a case in which the coefficient of linear expansion of the motherboard is smaller than that of the sealing resin layer, the center point of the end surface at one end of the columnar conductor is displaced in a direction toward the peripheral edge of one main surface of the wiring substrate from the center point of the connecting surface of the substrate electrode to be connected to the columnar conductor. It is thus possible to prevent the occurrence of interface separation between the wiring substrate and the substrate electrode in a manner similar to the case in which the coefficient of linear expansion of the motherboard is greater than that of the sealing resin layer.

The intermediate coating may be formed of a metal. Then, the intermediate coating can be formed by plating, thereby enhancing the practicality. Additionally, metal has ductility, and thus, the intermediate coating may serve as a cushioning member for relaxing stress applied to the columnar conductor caused by the expansion and contraction of the sealing resin layer.

The intermediate coating may also cover a portion of a connecting surface of the substrate electrode which is connected to and opposes the columnar conductor. More specifically, the intermediate coating may cover the connecting surface of the substrate electrode which is not in contact with the columnar conductor. With this configuration, the intermediate coating is interposed between the sealing resin layer and a portion of the connecting surface of the substrate electrode, which is not in contact with the columnar conductor. Thus, stress applied to the interface between the wiring substrate and the substrate electrode caused by the expansion and contraction of the sealing resin layer is relaxed by the intermediate coating, thereby further reducing the possibility that interface separation will occur between the wiring substrate and the substrate electrode.

The area of the connecting surface of the substrate electrode may be substantially the same as that of a connecting surface of the columnar conductor which is connected to and opposes the substrate electrode. With this configuration, the substrate electrode as viewed from above can be reduced in size and be disposed at a narrower pitch. It is thus possible to reduce the size of the module while securing the reliability of the module in terms of its connection to, for example, an external motherboard.

The columnar conductor may have a step portion in its longitudinal direction. With this configuration, the contact area between the columnar conductor and the intermediate coating and that between the intermediate coating and the sealing resin layer are increased by the amount by which the step portion is provided. Accordingly, it is possible to increase the adhesion strength at the interface between the columnar conductor and the intermediate coating and that between the intermediate coating and the sealing resin layer.

The cross sectional area of one end of the columnar conductor which is connected to the substrate electrode may be greater than that of the other end of the columnar conductor. With this configuration, by the provision of the sealing resin layer covering the columnar conductor, the displacement of the columnar conductor in the direction toward the other end thereof is restricted. Thus, when, for example, a motherboard is positioned under the module and the other end of the columnar conductor is connected to the motherboard, the columnar conductor can be prevented from dropping from the module toward the motherboard.

According to the present disclosure, the outer peripheral surface of the columnar conductor of the module is covered with the intermediate coating. Thus, the intermediate coating is interposed between the sealing resin layer and the columnar conductor. For example, when the module is mounted on, for example, an external motherboard, stress may be applied to the columnar conductor due to the difference in the coefficient of linear expansion (difference in the degree of expansion and contraction) between the motherboard and the sealing resin layer of the module. Even in this case, the intermediate coating serves as a stress relaxing member so as to relax the stress applied to the columnar conductor. It is thus possible to prevent the occurrence of interface separation between the wiring substrate and the substrate electrode and between the substrate electrode and the columnar conductor at the connecting portion between the columnar conductor and the wiring substrate, which may be caused by the stress applied to the columnar conductor.

Moreover, the coefficient of linear expansion of the intermediate coating is a value between that of the columnar conductor and that of the sealing resin layer. Accordingly, the difference in the coefficient of linear expansion between the columnar conductor and the intermediate coating and that between the intermediate coating and the sealing resin layer are smaller. Accordingly, compared with a module in which a columnar conductor is sealed with a sealing resin layer without an intermediate coating therebetween, it is possible to reduce the application of stress to the interface between the columnar conductor and the intermediate coating and the interface between the intermediate coating and the sealing resin layer, which may be caused by the difference in the degree of expansion and contraction due to a temperature change. Because of the reduced stress, it is less likely that interface separation will occur between the columnar conductor and the intermediate coating and between the intermediate coating and the sealing resin layer. As a result, the side surfaces of the columnar conductor are more likely to be supported by the sealing resin layer by the provision of the intermediate coating. Accordingly, it is possible to prevent the concentration of stress applied to the columnar conductor on the connecting portion between the columnar conductor and the wiring substrate, which may be caused by the interface separation between the columnar conductor and the sealing resin layer observed in a module. Thus, it is possible to prevent the occurrence of interface separation between the wiring substrate and the substrate electrode and between the substrate electrode and the columnar conductor.

DETAILED DESCRIPTION

First Embodiment

Figure 1:
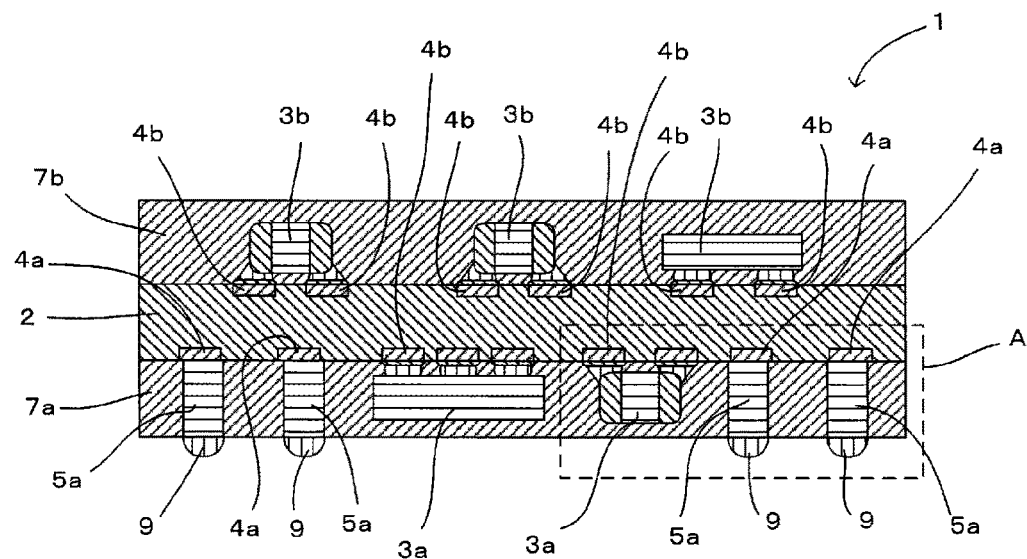
FIG. 1 is a sectional view of a module according to a first embodiment of the present disclosure.
Figure 2:
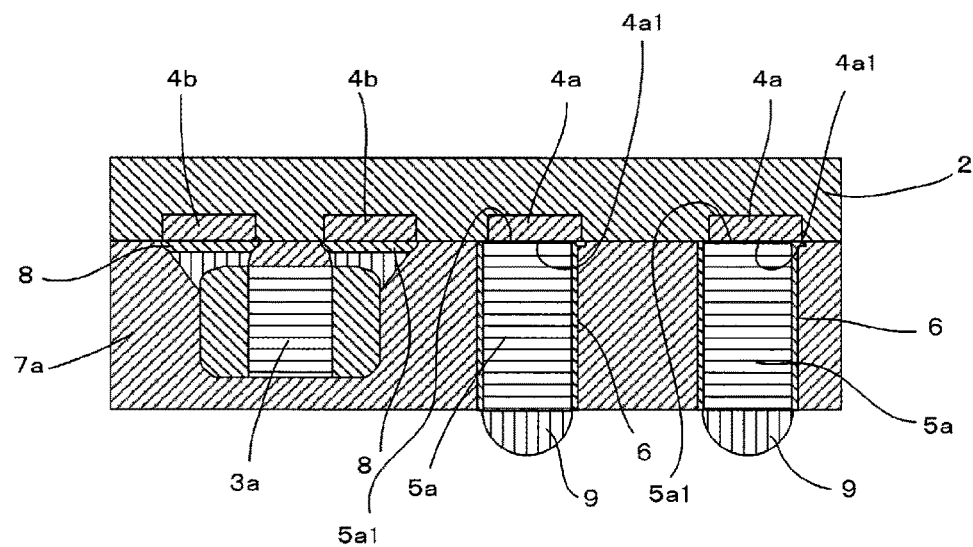
FIG. 2 is a partial sectional view of the module shown in FIG. 1.
Figure 3A:
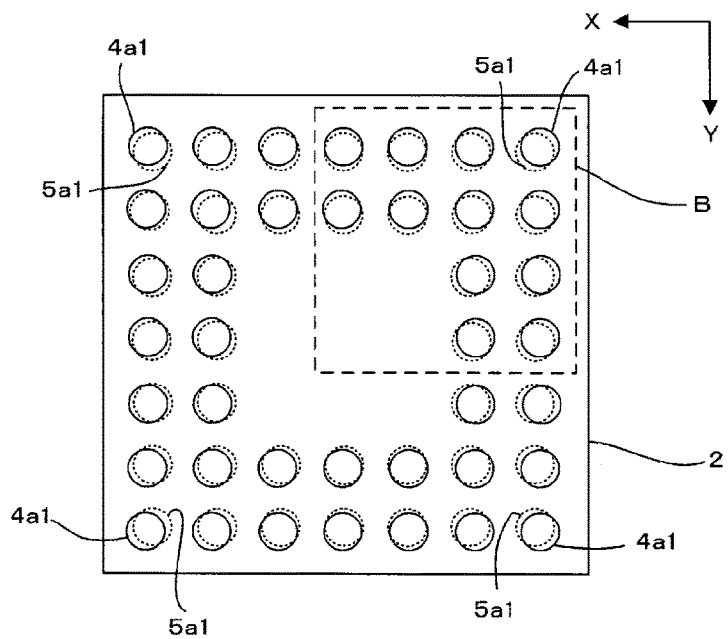
FIGS. 3A and 3B show views illustrating a wiring substrate of the module shown in FIG. 1.
Figure 3B:
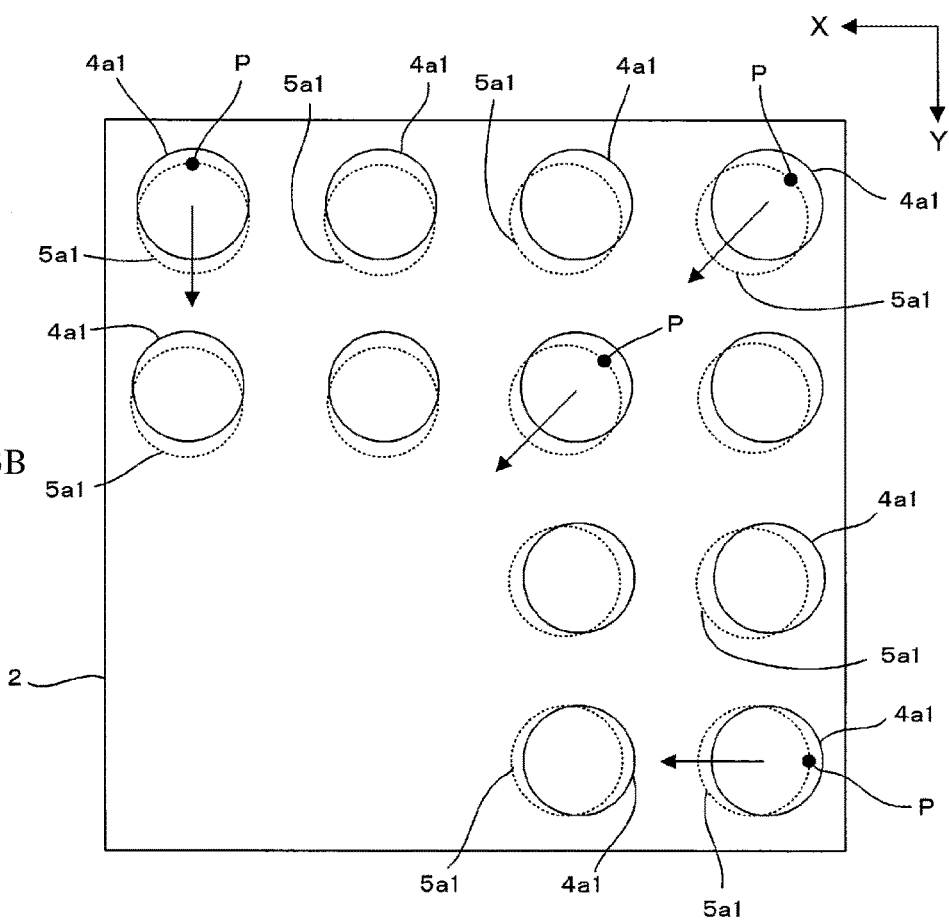

A module 1 according to a first embodiment of the present disclosure will be described below with reference to FIGS. 1 through 3. FIG. 1 is a sectional view of the module 1 of the first embodiment. FIG. 2 is an enlarged view of region A shown in FIG. 1. FIG. 3A is a plan view of a wiring substrate of the module 1 and FIG. 3B is an enlarged view of region B shown in FIG. 3A.

As shown in FIGS. 1 and 2, the module 1 of this embodiment includes: a wiring substrate 2; a plurality of components 3a and 3b mounted on both main surfaces of the wiring substrate 2; a plurality of substrate electrodes 4a formed on one main surface of the wiring substrate 2; a plurality of land electrodes 4b used for mounting components formed on both main surfaces of the wiring substrate 2; a plurality of columnar conductors 5a each of which is connected at one end to the associated substrate electrode 4a; an intermediate coating 6 that covers the outer peripheral surface of each of the columnar conductors 5a; a first sealing resin layer 7a (corresponding to a sealing resin layer of the present disclosure) that covers one main surface of the wiring substrate 2, the intermediate coating 6, and the components 3a mounted on one main surface of the wiring substrate 2; and a second sealing resin layer 7b that covers the other main surface of the wiring substrate 2 and the components 3b mounted on the other main surface of the wiring substrate 2. The module 1 is mounted on a motherboard, which may be provided in various electronic devices.

The wiring substrate 2 is a multilayer wiring substrate made of, for example, a glass epoxy resin or low temperature co-fired ceramic (LTCC). On both main surfaces and within the wiring substrate 2, wiring electrodes (not shown) and via-conductors (not shown) are formed. The wiring substrate 2 may be formed as a single-layer structure.

The substrate electrodes 4a formed on one main surface of the wiring substrate 2 and the land electrodes 4b formed on both main surfaces of the wiring substrate 2 are made of a metal, such as Cu or Al (Cu in this embodiment), and are formed by using an electrode forming technology, such as a printing technology or a photolithography technology. As shown in FIG. 2, Ni/Au plating 8 is applied on a mounting surface of each land electrode 4b to be connected to the component 3a or 3b. In this embodiment, the substrate electrodes 4a and the columnar conductors 5a are formed so that the area of a connecting surface 4a1 of the substrate electrode 4a which is connected to and opposes the columnar conductor 5a may be substantially the same as the area of an end surface 5a1 at one end of the columnar conductor 5a, which is a connecting surface that is connected to and opposes the substrate electrode 4a.

The components 3a and 3b mounted on both main surfaces of the wiring substrate 2 are constituted by semiconductor elements made of Si or GaAs and chip components, such as chip inductors and chip capacitors. The components 3a and 3b are mounted on both main surfaces of the wiring substrate 2 by using a surface mount technology.

The columnar conductors 5a are made of a metal, such as Cu, and are formed on the substrate electrodes 4a by electroplating or electroless plating. One end of each of the columnar conductors 5a is connected to the associated substrate electrode 4a. The columnar conductors 5a are formed by plating growth on the substrate electrodes 4a. Alternatively, the columnar conductors 5a may be formed by connecting, for example, pin-shaped conductors, to the substrate electrodes 4a by soldering. In this embodiment, solder bumps 9 for connecting the module 1 to an external motherboard are formed on the end surfaces of the columnar conductors 5a at the other ends thereof.

The intermediate coating 6 is made of a Ni/Au film, and is disposed for each of the columnar conductors 5a. As shown in FIG. 2, the intermediate coating 6 covers the outer peripheral surface of the associated columnar conductor 5a and a portion of the connecting surface 4a1 of the substrate electrode 4a, which is not in contact with the columnar conductor 5a. After the first sealing resin layer 7a, which will be discussed later, has been formed, the intermediate coating 6 is interposed between the first sealing resin layer 7a and the associated columnar conductor 5a.

The first and second sealing resin layers 7a and 7b are formed of, for example, an epoxy resin. The first sealing resin layer 7a covers one main surface of the wiring substrate 2, the intermediate coatings 6 that cover the outer peripheral surfaces of the columnar conductors 5a, and the components 3a mounted on one main surface of the wiring substrate 2. The second sealing resin layer 7b covers the other main surface of the wiring substrate 2 and the components 3b mounted on the other main surface of the wiring substrate 2. The first and second sealing resin layers 7a and 7b may be formed by using one of methods, such as application, printing, compression molding, and transfer molding.

In this embodiment, the coefficient of linear expansion of the wiring substrate 2, which is made of a ceramic or glass epoxy resin, is 7 to 14 ppm/° C., the coefficient of linear expansion of the substrate electrodes 4a and the columnar conductors 5a made of Cu is 17 ppm/° C., the coefficient of linear expansion of each of the first and second sealing resin layers 7a and 7b is 5 to 13 ppm/° C. (and can be 5 to 10 ppm/° C.), and the coefficients of linear expansion of the Ni/Au film forming the intermediate coatings 6 is 13 ppm/° C. (Ni) and 14 ppm/° C. (Au). The coefficient of linear expansion of the intermediate coatings 6 is a value between that of the first sealing resin layer 7a and that of the columnar conductors 5a (or the substrate electrodes 4a).

The positional relationship between the columnar conductors 5a and the substrate electrodes 4a will be discussed below with reference to FIGS. 2 and 3.

As discussed above, in this embodiment, the wiring substrate 2 is made of a glass epoxy resin or ceramic, and the columnar conductors 5a and the substrate electrodes 4a are made of Cu. Accordingly, concerning the connecting portions between the wiring substrate 2 and the columnar conductors 5a, that is, concerning the interface between the columnar conductors 5a and the substrate electrodes 4a and the interface between the wiring substrate 2 and the substrate electrodes 4a, the interface between the columnar conductors 5a and the substrate electrodes 4a is a connecting portion of the same material, that is, Cu, while the interface between the wiring substrate 2 and the substrate electrodes 4a is a connecting portion of different materials, that is, a glass epoxy resin or ceramic and Cu. Accordingly, the adhesion strength of the interface between the wiring substrate 2 and the substrate electrodes 4a is smaller than that between the columnar conductors 5a and the substrate electrodes 4a. In accordance with a recent demand for decreasing the size of the module 1, the size of the substrate electrodes 4a is also being reduced. In this case, the contact area between the wiring substrate 2 and the substrate electrodes 4a becomes smaller, thereby further decreasing the adhesion strength between the wiring substrate 2 and the substrate electrodes 4a.

Therefore, in this embodiment, the peripheral edge of the contact portion between the wiring substrate 2 and each substrate electrode 4a from which the occurrence of interface separation may start is displaced in a predetermined direction from the location of the connecting portion between the wiring substrate 2 and the associated columnar conductor 5a where stress applied to the columnar conductors 5a acts most intensely. With this configuration, it is possible to prevent the occurrence of interface separation between the wiring substrate 2 and the substrate electrodes 4a having a small adhesion strength. The above-described predetermined direction is a direction of a shear stress applied to the connecting portions between the columnar conductors 5a and the substrate electrodes 4a due to a temperature drop and caused by the difference in the coefficient of linear expansion between the first sealing resin layer 7a and a motherboard to which the other ends of the columnar conductors 5a are connected.

A description will be given more specifically of the directions of a shear stress applied to the connecting portions between the wiring substrate 2 and the columnar conductors 5a due to a temperature drop and caused by the difference in the degree of contraction between the first sealing resin layer 7a and an external unit such as a motherboard on which the module 1 is mounted and to which the other ends of the columnar conductors 5a are connected. In a case in which the coefficient of linear expansion of the motherboard is greater than that of the first sealing resin layer 7a, the directions of the shear stress are directions indicated by the arrows in FIG. 3B, that is, the directions toward the center of one main surface of the wiring substrate 2. In this case, the area where the shearing stress becomes most intensified is toward the peripheral edge of one main surface of the wiring substrate 2 in the area of the peripheral edge of the end surface 5a1 at one end of each columnar conductor 5a. That is, in the area of the peripheral edge of the end surface 5a1 at one end of each columnar conductor 5a, the vicinity near the point P intersecting with the outer periphery of the end surface 5a1 when each arrow shown in FIG. 3B is extended in the direction opposite from the head of the arrow is the area where the shearing stress becomes most intensified. Therefore, in this embodiment, in each of the columnar conductors 5a, the center point of the end surface 5a1 at one end of the columnar conductor 5a is displaced in a direction toward the center of one main surface of the wiring substrate 2 from the center point of the connecting surface 4a1 of the substrate electrode 4a which is connected to and opposes the columnar conductor 5a.

The shearing stress applied to the connecting portion between a columnar conductor 5a and the wiring substrate 2 becomes stronger as the columnar conductor 5a is located farther toward the peripheral edge of one main surface of the wiring substrate 2. Accordingly, in this embodiment, as the columnar conductor 5a is located farther toward the peripheral edge of one main surface of the wiring substrate 2, the amount by which the columnar conductor 5a is displaced from the substrate electrode 4a is set to be greater. However, it is not always necessary to change the displacement amount of the columnar conductor 5a in accordance with its location, and all the columnar conductors 5a may be displaced from the substrate electrode 4a by the same amount. Alternatively, the direction of displacement may be simplified in the following manner. The shearing stress may be decomposed into components in the X and Y directions of one main surface of the wiring substrate 2 shown in FIGS. 3A and 3B. In this case, if the magnitude of the shearing stress of the X-direction component is different from that of the Y-direction component, for example, if the magnitude of the shearing stress of the X-direction component is greater than that of the Y-direction component, the columnar conductors 5a may be displaced in the X direction.

If the columnar conductors 5a are displaced in the above-described manner, the peripheral edges of the contact areas between the wiring substrate 2 and the substrate electrodes 4a from which the occurrence of interface separation may start can be separated from the points P where the shearing stress becomes most intensified. Accordingly, stress applied to the peripheral edges of the contact areas between the wiring substrate 2 and the substrate electrodes 4a from which the occurrence of interface separation may start is reduced. It is thus possible to prevent interface separation between the wiring substrate 2 and the substrate electrodes 4a, which may occur upon the application of stress to the columnar conductors 5a.

In a case in which the coefficient of linear expansion of the motherboard is smaller than that of the first sealing resin layer 7a, the directions of a shearing stress applied to the connecting portions between the wiring substrate 2 and the columnar conductors 5a due to a temperature drop are opposite from the directions of the arrows shown in FIG. 3B. Accordingly, in this case, each columnar conductor 5a is displaced in a direction opposite from the direction in which the center point of the end surface 5a1 at one end of the columnar conductor 5a is displaced in a case in which the coefficient of linear expansion of the motherboard is greater than that of the first sealing resin layer 7a. That is, the center point of the end surface 5a1 is displaced in a direction toward the peripheral edge of one main surface of the wiring substrate 2 from the center point of the connecting surface 4a1 of the substrate electrode 4a which is connected to and opposes the columnar conductor 5a.

(Manufacturing Method for Module 1)

A manufacturing method for the module 1 will be described below with reference to FIGS. 4 and 5. FIGS. 4 and 5 are partial sectional views of the module 1 corresponding to FIG. 2 and illustrating a manufacturing method for the module 1. FIGS. 4A-4F illustrate steps for the manufacturing method, and FIGS. 5A-5C illustrate steps continuing from the step shown in FIG. 4F.

Figure 4A:
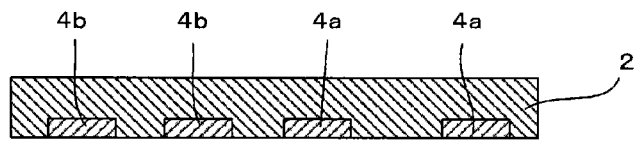
FIGS. 4A-4F show views illustrating a manufacturing method for the module shown in FIG. 1.
Figure 5A:
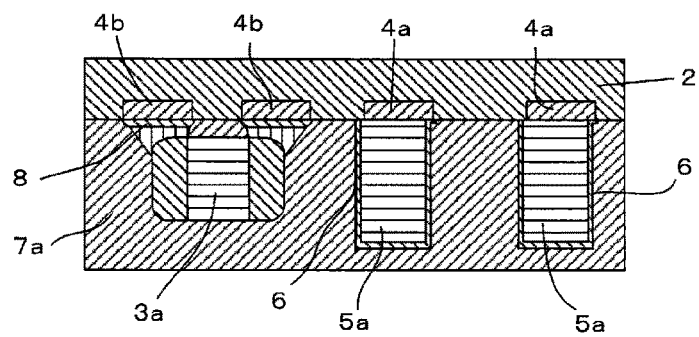
FIGS. 5A-5C show views illustrating a manufacturing method for the module shown in FIG. 1.
Figure 5B:
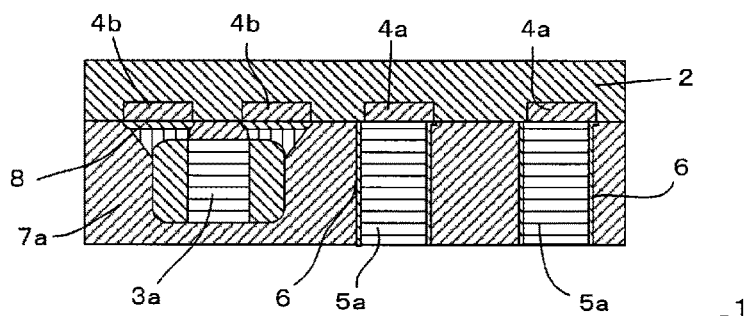
Figure 5C:
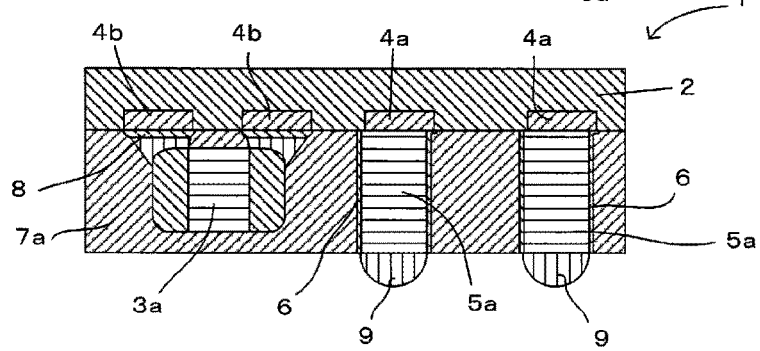

As shown in FIG. 4A, a wiring substrate 2 is prepared. On one main surface of the wiring substrate 2, a plurality of substrate electrodes 4a and a plurality of land electrodes 4b, both of which are made of Cu, are formed. On the other main surface of the wiring substrate 2, a plurality of land electrodes 4b made of Cu are formed. In this case, the substrate electrodes 4a and the land electrodes 4b are formed by using an electrode forming technology, such as a printing technology or a photolithography technology. On the main surfaces and within the wiring substrate 2, various wiring electrodes and via-conductors are formed.

Figure 4B:
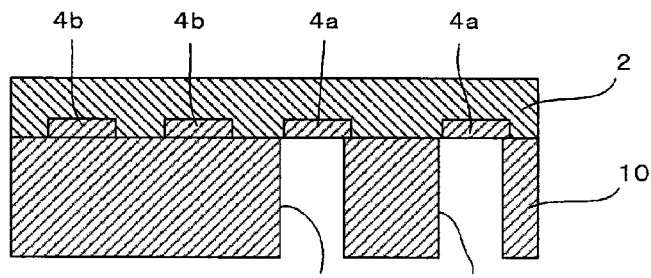

Then, as shown in FIG. 4B, after forming a resist 10 on one main surface of the wiring substrate 2, cavities 11 are formed in the resist 10 at positions at which columnar conductors 5a will be formed, by using, for example, a photolithography technology. In this case, the cavities 11 are formed in the resist 10 so that the center point of the end surface 5a1 at one end of each columnar conductor 5a will be displaced in a direction toward the center of one main surface of the wiring substrate 2 from the center point of the connecting surface 4a1 of the substrate electrode 4a which is connected to and opposes the columnar conductor 5a.

Figure 4C:
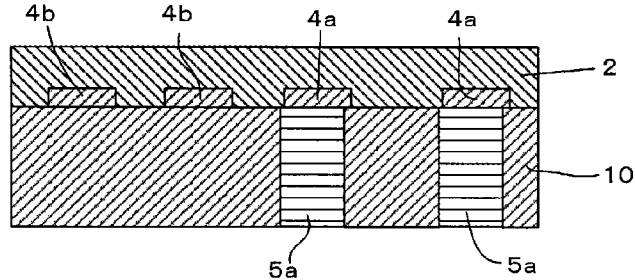
Figure 4D:
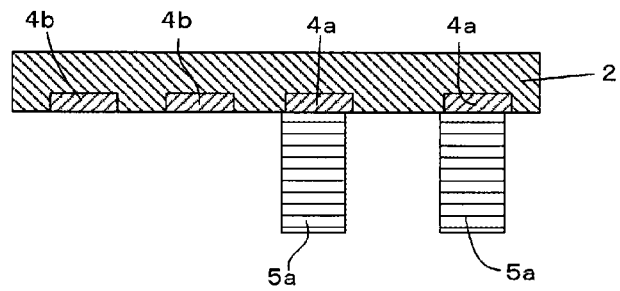

Then, as shown in FIG. 4C, after columnar conductors 5a made of Cu are formed within the cavities 11 of the resist 10 by, for example, plating, the resist 10 is removed, as shown in FIG. 4D.

Figure 4E:
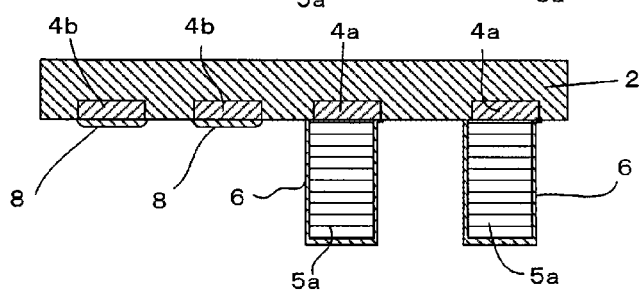

Then, as shown in FIG. 4E, intermediate coatings 6 made of Ni/Au are formed by, for example, plating. The intermediate coating 6 covers the outer peripheral surface and the end surface of each columnar conductor 5a at the other end thereof and a portion of the connecting surface 4a1 of the substrate electrode 4a, which is not in contact with the associated columnar conductor 5a. In this case, Ni/Au plating 8 is also applied to the surfaces of the land electrodes 4b formed on both main surfaces of the wiring substrate 2.

Figure 4F:
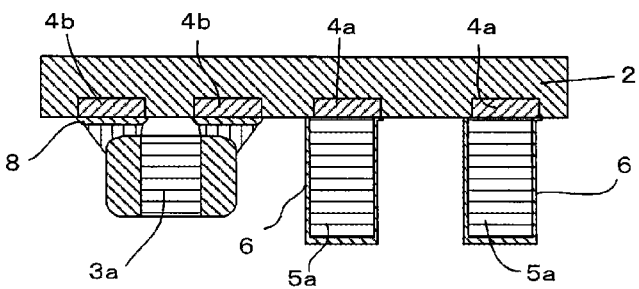

Then, as shown in FIG. 4F, components 3a are mounted on one main surface of the wiring substrate 2 by using a surface mount technology. Then, as shown in FIG. 5A, a first sealing resin layer 7a for covering one main surface of the wiring substrate 2, the components 3a mounted on one main surface of the wiring substrate 2, and the intermediate coatings 6 is formed. The first sealing resin layer 7a may be formed by using one of methods, such as application, printing, compression molding, and transfer molding.

Then, after mounting components 3b on the other main surface of the wiring substrate 2, a second sealing resin layer 7b for covering the other main surface of the wiring substrate 2 and the components 3b is formed. The second sealing resin layer 7b may be formed by using a method similar to that used for forming the first sealing resin layer 7a.

Then, as shown in FIG. 5B, by polishing or grinding the surface of the first sealing resin layer 7a, the end surface at the other end of each columnar conductor 5a is exposed. Then, as shown in FIG. 5C, a solder bump 9 is formed on the exposed end surface at the other end of each columnar conductor 5a. As a result, the module 1 is manufactured. Before forming the solder bump 9 on the end surface at the other end of each columnar conductor 5a, a Ni/Au film may be formed on the end surface at the other end of the columnar conductor 5a.

The mounting of the components 3b on the other main surface of the wiring substrate 2 may be performed before or after the mounting of the components 3a on one main surface of the wiring substrate 2, and then, the first and second sealing resin layers 7a and 7b may be formed at the same time. Alternatively, after polishing or grinding the surface of the first sealing resin layer 7a, the components 3b may be mounted on the other main surface of the wiring substrate 2, and then, the second sealing resin layer 7b may be formed.

In the above-described embodiment, the intermediate coating 6 is interposed between the first sealing resin layer 7a and each columnar conductor 5a. For example, when the module 1 is mounted on an external motherboard, stress may be applied to the columnar conductors 5a due to the difference in the coefficient of linear expansion (difference in the degree of expansion and contraction) between the motherboard and the first sealing resin layer 7a of the module 1. Even in this case, the intermediate coatings 6 serve as a stress relaxing member so as to relax the stress applied to the columnar conductors 5a. It is thus possible to prevent the occurrence of separation at the connecting portion between each columnar conductor 5a and the wiring substrate 2, which may be caused by the stress applied to the columnar conductor 5a, that is, at the interface between the wiring substrate 2 and the substrate electrode 4a and at the interface between the substrate electrode 4a and the columnar conductor 5a. Moreover, the coefficient of linear expansion of the intermediate coatings 6 is a value between that of the columnar conductors 5a and that of the first sealing resin layer 7a. Accordingly, the difference in the coefficient of linear expansion between the columnar conductor 5a and the intermediate coating 6 and that between the intermediate coating 6 and the first sealing resin layer 7a are smaller. Accordingly, compared with a module in which the columnar conductors 5a are sealed with the first sealing resin layer 7a without necessarily the intermediate coatings 6 therebetween, it is possible to reduce the application of stress to the interface between the columnar conductor 5a and the intermediate coating 6 and the interface between the intermediate coating 6 and the first sealing resin layer 7a, which may be caused by the difference in the degree of expansion and contraction due to a temperature drop. Thus, it is less likely that interface separation will occur between each columnar conductor 5a and the intermediate coating 6 and between the intermediate coating 6 and the first sealing resin layer 7a. As a result, the side surfaces of the columnar conductor 5a are more likely to be supported by the first sealing resin layer 7a by the provision of the intermediate coating 6.

When a module is mounted on, for example, a motherboard, stress may be applied to the columnar conductor 5a due to the difference in the coefficient of linear expansion (difference in the degree of expansion and contraction) between the motherboard and the sealing resin layer of the module. In this case, if the side surfaces of the columnar conductor 5a are separated from the first sealing resin layer 7a and are not supported by it, the stress is concentrated on the connecting portion between the columnar conductor 5a and the wiring substrate 2. On the other hand, as in this embodiment, if the side surfaces of each columnar conductor 5a are supported by the first sealing resin layer 7a, stress applied to the columnar conductor 5a is also distributed over the interface between the columnar conductor 5a and the intermediate coating 6 and between the intermediate coating 6 and the first sealing resin layer 7a. Accordingly, it is possible to prevent the concentration of stress applied to each columnar conductor 5a on the connecting portion between the columnar conductor 5a and the wiring substrate 2, which may be caused by the interface separation between the columnar conductor 5a and the first sealing resin layer 7a observed in a module. Thus, it is possible to prevent the occurrence of interface separation between the wiring substrate 2 and the substrate electrodes 4a and between the substrate electrodes 4a and the columnar conductors 5a. As a result, the module 1 having high reliability in terms of its connection to an external unit can be provided.

The peripheral edge of the contact portion between the wiring substrate 2 and the substrate electrode 4a from which the occurrence of interface separation may start is desirably separated from the location of the connecting portion between the wiring substrate 2 and the columnar conductor 5a where stress applied to the columnar conductors 5a becomes most intensified, that is, the peripheral portion of the end surface 5a1 (see the point P in FIG. 3B) at one end of the columnar conductor 5a. Thus, in each of the columnar conductors 5a, the center point of the end surface 5a1 at one end of the columnar conductor 5a is displaced from the center point of the connecting surface 4a1 of the substrate electrode 4a to be connected to the columnar conductor 5a. With this configuration, the occurrence of interface separation between the wiring substrate 2 and the substrate electrode 4a is prevented, thereby further enhancing the reliability of the module 1 in terms of its connection to an external unit.

Since the intermediate coating 6 is formed of a Ni/Au film, it can be formed by plating, thereby enhancing the practicality. Additionally, metal has ductility, and thus, the intermediate coating 6 may serve as a cushioning member for relaxing stress applied to the columnar conductor 5a caused by the expansion and contraction of the first sealing resin layer 7a.

The intermediate coating 6 also covers a portion of the connecting surface 4a1 of the substrate electrode 4a, which is not in contact with the columnar conductor 5a. Accordingly, the intermediate coating 6 is interposed between this portion of the connecting surface 4a1 and the first sealing resin layer 7a. Thus, stress applied to the interface between the wiring substrate 2 and the substrate electrode 4a caused by the expansion and contraction of the first sealing resin layer 7a is relaxed by the intermediate coating 6, thereby further reducing the possibility that interface separation will occur between the wiring substrate 2 and the substrate electrode 4a. Moreover, the coefficient of linear expansion of the intermediate coating 6 is a value between that of the substrate electrodes 4a and that of the first sealing resin layer 7a. Accordingly, it is possible to reduce the application of stress to the interface between the intermediate coating 6 and the substrate electrode 4a and the interface between the intermediate coating 6 and the first sealing resin layer 7a caused by a temperature change, thereby increasing the adhesion characteristics of these interfaces.

In each of the substrate electrodes 4a, the area of the connecting surface 4a1 of the substrate electrode 4a which is connected to and opposes the associated columnar conductor 5a is set to be substantially the same as the area of the end surface 5a1 at one end of the columnar conductor 5a. With this configuration, the substrate electrode 4a as viewed from above can be reduced in size and be disposed at a narrower pitch. It is thus possible to reduce the size of the module 1 while securing the reliability of the module 1 in terms of its connection to an external unit, such as a motherboard.

Second Embodiment

Figure 6:
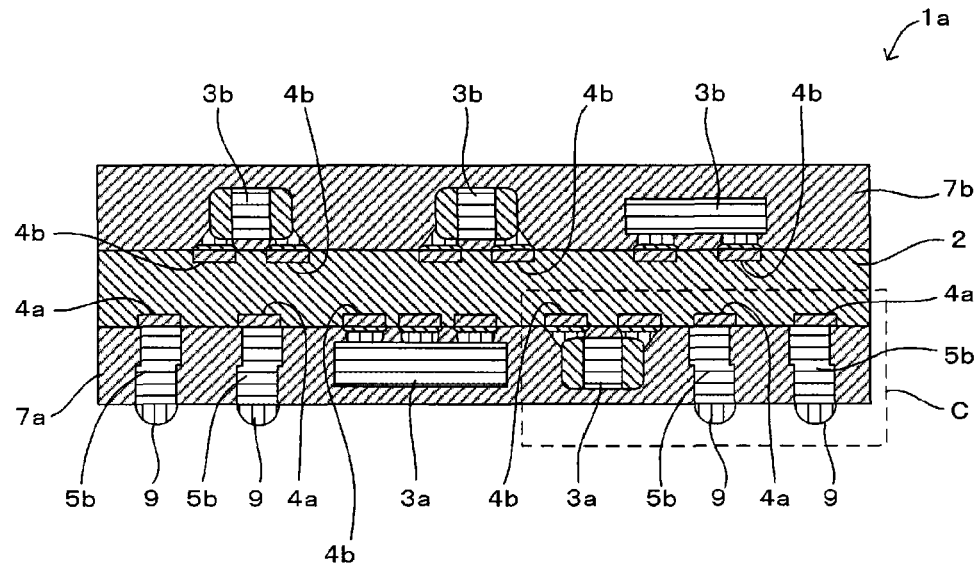
FIG. 6 is a sectional view of a module according to a second embodiment of the present disclosure.

A module 1a according to a second embodiment of the present disclosure will be described below with reference to FIGS. 6 and 7. FIG. 6 is a sectional view of the module 1a, and FIG. 7 is an enlarged view of region C shown in FIG. 6.

Figure 7:
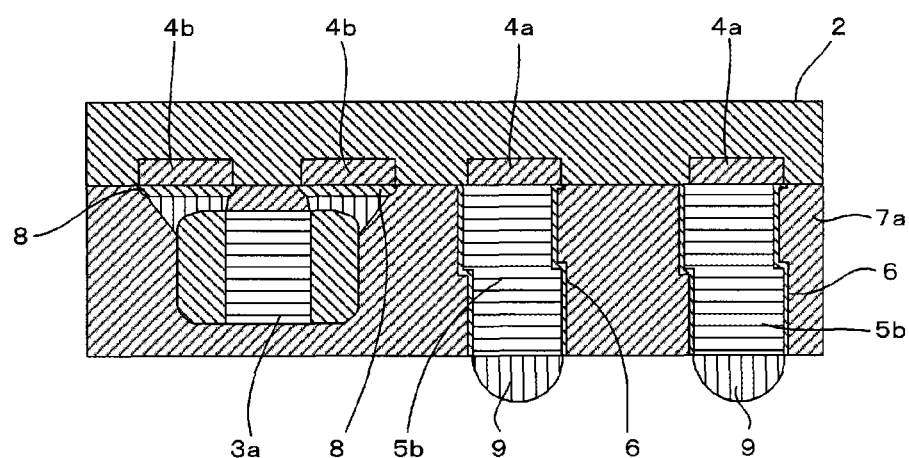
FIG. 7 is a partial sectional view of the module shown in FIG. 6.

The module 1a of this embodiment is different from the module 1 of the first embodiment discussed with reference to FIGS. 1 through 3 in that each columnar conductor 5b has a step portion in its longitudinal direction, as shown in FIGS. 6 and 7. The configurations of the other elements are the same as those of the first embodiment, and thus, they are designated by like reference numerals and an explanation thereof will be omitted.

Each columnar conductor 5b has a step portion in its longitudinal direction, and the outer peripheral surface of the step portion is covered with an intermediate coating 6. It is assumed that the coefficient of linear expansion of a motherboard to which the other end of each columnar conductor 5b is connected is greater than that of the first sealing resin layer 7a. Accordingly, as in the module 1 of the first embodiment, in each columnar conductor 5b, the center point of the end surface at one end of the columnar conductor 5b which is connected to and opposes the substrate electrode 4a is displaced in a direction toward the center of one main surface of the wiring substrate 2 from the center point of the connecting surface of the substrate electrode 4a which is connected to and opposes the columnar conductor 5b.

(Manufacturing Method for Module 1a)

A manufacturing method for the module 1a will be described below with reference to FIGS. 8 and 9. FIGS. 8 and 9 are partial sectional views of the module 1a corresponding to FIG. 7 and illustrating a manufacturing method for the module 1a. FIGS. 8A-8F illustrate steps for the manufacturing method, and FIGS. 9A-9E illustrate steps continuing from the step shown in FIG. 8F.

Figure 8A:
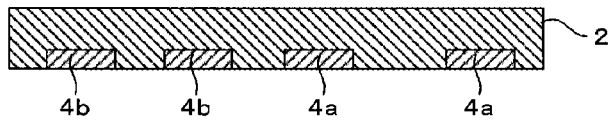
FIGS. 8A-8F show views illustrating a manufacturing method for the module shown in FIG. 6.

As shown in FIG. 8A, a wiring substrate 2 is prepared. On one main surface of the wiring substrate 2, a plurality of substrate electrodes 4a and a plurality of land electrodes 4b, both of which are made of Cu, are formed. On the other main surface of the wiring substrate 2, a plurality of land electrodes 4b made of Cu are formed. In this case, the substrate electrodes 4a and the land electrodes 4b are formed by using an electrode forming technology, such as a printing technology or a photolithography technology. On the main surfaces and within the wiring substrate 2, various wiring electrodes and via-conductors are formed.

Figure 8B:
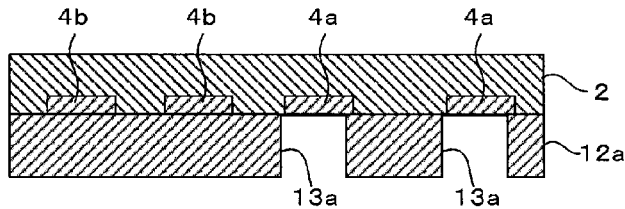

Then, as shown in FIG. 8B, after forming a first resist 12a on one main surface of the wiring substrate 2, first cavities 13a are formed in the resist 12a at positions at which columnar conductors 5b will be formed, by using, for example, a photolithography technology. In this case, the cavities 13a are formed in the resist 12a so that the center point of the end surface at one end of each columnar conductor 5b will be displaced in a direction toward the center of one main surface of the wiring substrate 2 from the center point of the connecting surface of the substrate electrode 4a which will oppose and be connected to the columnar conductor 5b. Also in this case, the resist 12a is formed so that the thickness thereof will be smaller than the length of each of the columnar conductors 5b.

Figure 8C:
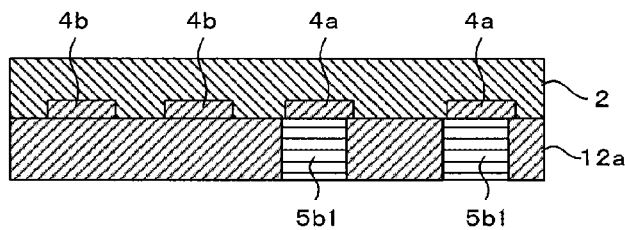

Then, as shown in FIG. 8C, first portions 5b1 of the columnar conductors 5b made of Cu are formed by, for example, plating.

Figure 8D:
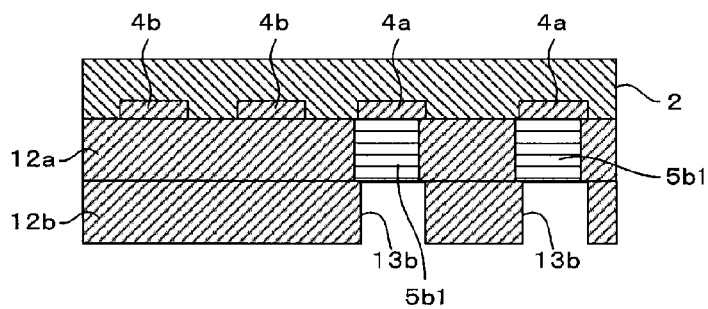

Then, as shown in FIG. 8D, a second resist 12b is formed on the first resist 12a (at the lower side in the plane of the drawing), and then, cavities 13b for forming second portions 5b2 of the columnar conductors 5b are formed in the resist 12b, by using, for example, a photolithography technology.

In this case, for forming step portions in the longitudinal direction of the columnar conductors 5b, the second cavities 13b are displaced from the first cavities 13a toward the peripheral end of one main surface of the wiring substrate 2 in a direction perpendicular to the longitudinal direction of the columnar conductors 5b. The direction in which the second cavities 13b are displaced is not restricted to a direction toward the peripheral end of one main surface of the wiring substrate 2, and may be a direction toward the center of the wiring substrate 2.

Figure 8E:
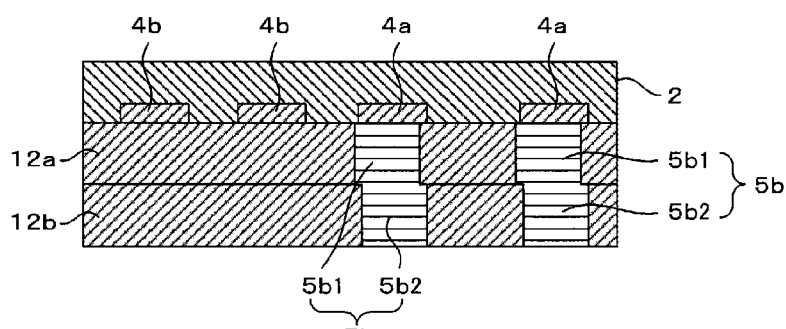
Figure 8F:
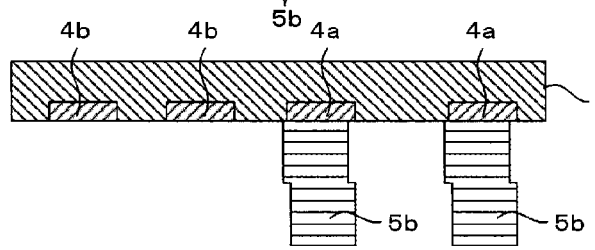
Figure 9A:
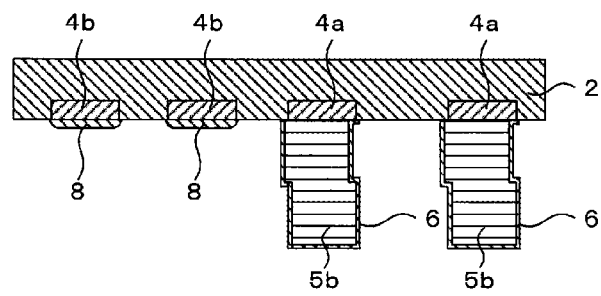
FIGS. 9A-9E show views illustrating a manufacturing method for the module shown in FIG. 6.
Figure 9B:
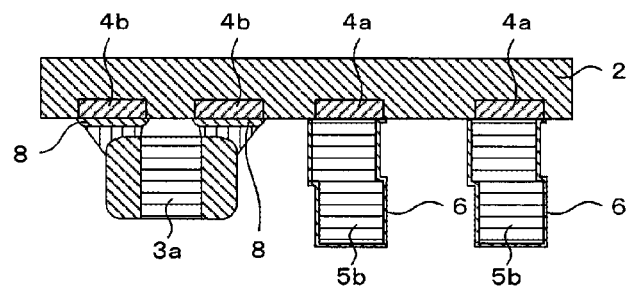
Figure 9C:
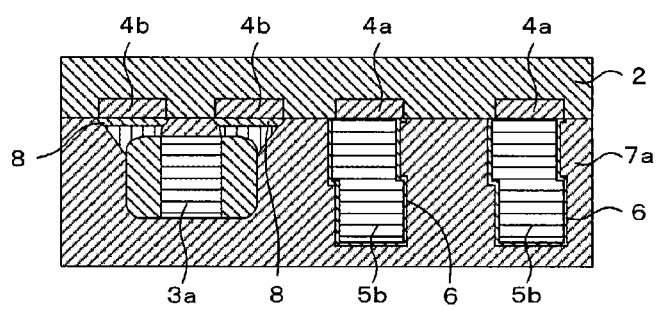
Figure 9D:
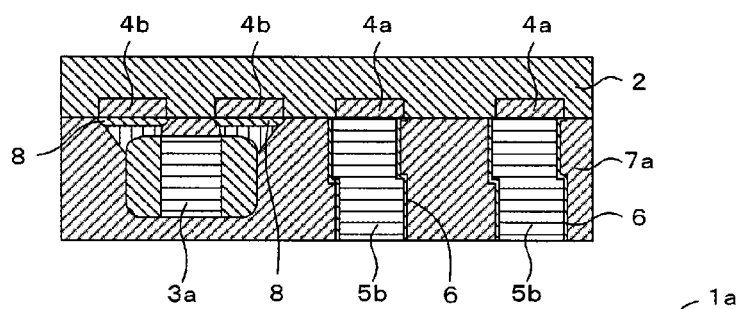
Figure 9E:
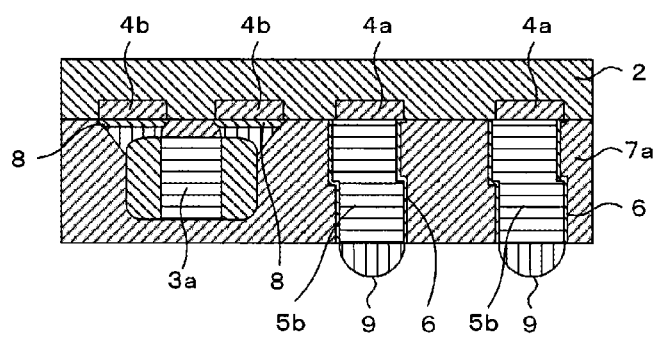

Then, as shown FIG. 8E, second portions 5b2 are formed in a manner similar to the first portions 5b1 of the columnar conductors 5b. Then, as shown in FIG. 8F, the first resist 12a and the second resist 12b are removed.

After removing the first resist 12a and the second resist 12b, in a manner similar to the manufacturing method for the module 1 of the first embodiment, the formation of intermediate coatings 6 and Ni/Au plating 8 on the land electrodes 4b (see FIG. 9A), the mounting of components 3a on one main surface of the wiring substrate 2 (see FIG. 9B), the formation of a first sealing resin layer 7a (see FIG. 9C), the mounting of components 3b on the other main surface of the wiring substrate 2, the formation of a second sealing resin layer 7b, and polishing of grinding of the surface of the first sealing resin layer 7a (see FIG. 9D), and the formation of a solder bump 9 on the end surface at the other end of each columnar conductor 5b (see FIG. 9E) are performed. As a result, the module 1a is manufactured.

In the above-described embodiment, by providing a step portion in each columnar conductor 5b in its longitudinal direction, the contact area between the columnar conductor 5b and the intermediate coating 6 and that between the intermediate coating 6 and the first sealing resin layer 7a are increased by the amount by which the step portion is provided. Accordingly, the adhesion strength at the interface between the columnar conductor 5b and the intermediate coating 6 and that between the intermediate coating 6 and the first sealing resin layer 7a is increased. Moreover, due to the provision of the step portion, the displacement of each columnar conductor 5b in its longitudinal direction is restricted. Thus, when, for example, a motherboard is positioned under the module 1a and the other end of each columnar conductor 5b is connected to the motherboard, the columnar conductor 5b can be prevented from dropping toward the motherboard.

(Modified Examples of Columnar Conductors)

Figure 10A:
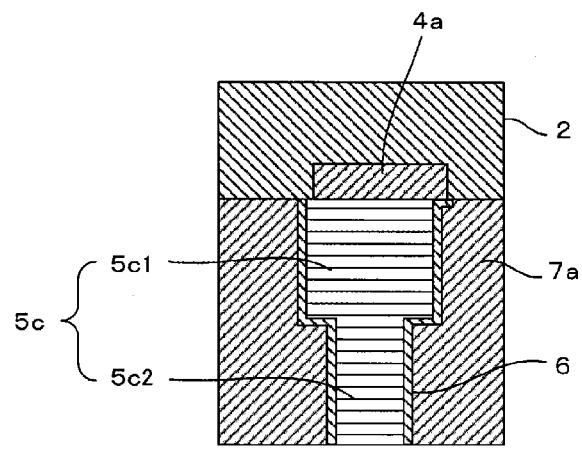
FIGS. 10A-10C show views illustrating modified examples of columnar conductors.
Figure 10B:
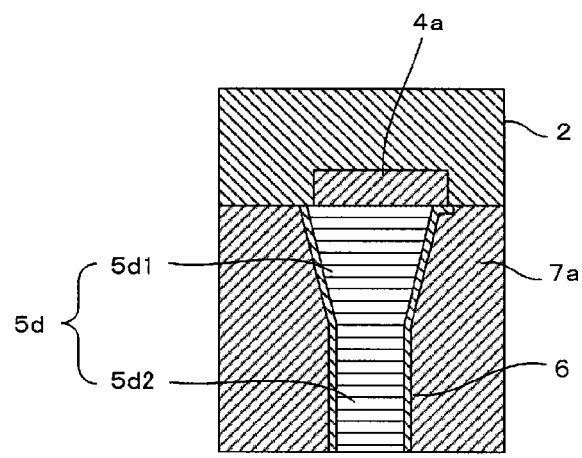
Figure 10C:
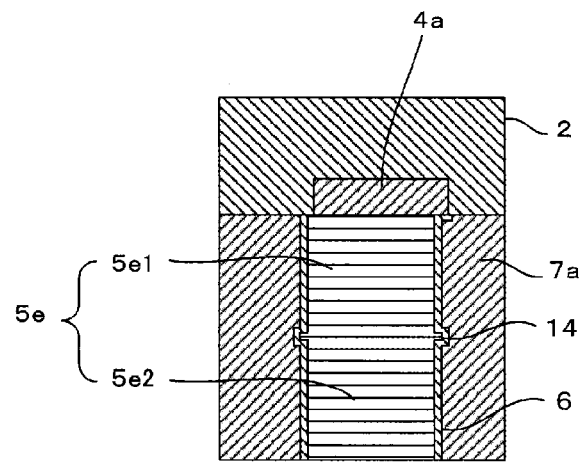
Figure 11:
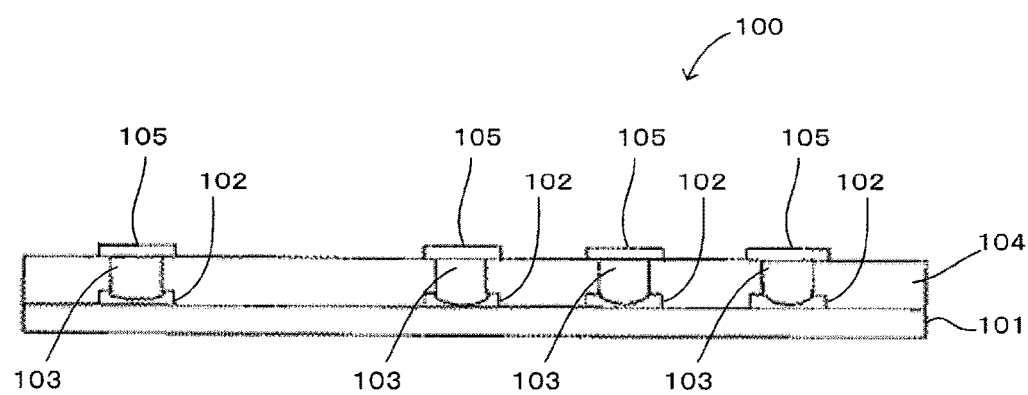
FIG. 11 is a sectional view of a module.

Modified examples of the columnar conductors will be described below with reference to FIGS. 10A-10C. FIGS. 10A-10C are respectively sectional views illustrating columnar conductors 5c through 5e of the modified examples.

For example, as shown in FIG. 10A, a step portion is provided in the longitudinal direction of the columnar conductor 5c, and at the same time, the cross sectional area of a first portion 5c1 of the columnar conductor 5c connected to the substrate electrode 4a may be set to be greater than that of a second portion 5c2 of the columnar conductor 5c connected to a motherboard. Alternatively, as shown in FIG. 10B, a first portion 5d1 of the columnar conductor 5d may be formed in a tapered shape such that the cross sectional area of the first portion 5d1 becomes smaller as the first portion 5d1 is located toward the lower side in the plane of the drawing, and the cross sectional area of a second portion 5d2 of the columnar conductor 5d may be set to be smaller than that of the first portion 5d1. Alternatively, as shown in FIG. 10C, a projecting portion 14 may be provided at the boundary between a first portion 5e1 and a second portion 5e2 on the outer peripheral surface of the columnar conductor 5e.

The configurations of the cross sectional areas of the first portions 5c1 through 5e2 of the columnar conductors 5c through 5e may be set to be different from those of the second portions 5c2 through 5e2. For example, the configurations of the cross sectional areas of the first portions 5c1 through 5e1 of the columnar conductors 5c through 5e may be set to be circular, while the configurations of the cross sectional areas of the second portions 5c2 through 5e2 may be set to be rectangular. If columnar conductors, such as the columnar conductors 5c through 5e of these modified examples, are formed, the contact area between each of the columnar conductors 5c through 5e and the intermediate coating 6 and the contact area between the intermediate coating 6 and the first sealing resin layer 7a are increased, compared with a case in which columnar conductors are formed in a straight shape. Thus, the adhesion strength is improved at the interface between each of the columnar conductors 5c through 5e and the intermediate coating 6 and the interface between the intermediate coating 6 and the first sealing resin layer 7a. Additionally, in the columnar conductors 5c and 5d shown in FIGS. 10A and 10B, the cross sectional areas of the first portions 5c1 and 5d1 at one end of each of the columnar conductors 5c and 5d are respectively set to be greater than those of the second portions 5c2 and 5d2 at the other end of each of the columnar conductors 5c and 5d. In the columnar conductor 5e shown in FIG. 10C, the projecting portion 14 is provided on the outer peripheral surface of the columnar conductor 5e. With these arrangements, the displacement in the longitudinal direction (lower side in the plane of the drawing) of the columnar conductors 5c through 5e is restricted so that the columnar conductors 5c through 5e can be prevented from dropping.

The present disclosure is not restricted to the above-described embodiments, and various modifications may be made without departing from the spirit of the disclosure. For example, in the module 1a of the second embodiment, a step portion is provided at one location of each columnar conductor 5b. However, a step portion may be provided at multiple locations of each columnar conductor 5b. In the above-described embodiments, the columnar conductors are formed by plating. Alternatively, the columnar conductors may be formed by using a conductive paste or a metallic pin.

The configuration in which the components 3b and the second sealing resin layer 7b are not formed on the other main surface of the wiring substrate 2 may be employed.

In the above-described embodiments, the columnar conductors 5a and 5b are displaced from the substrate electrodes 4a in a predetermined direction. However, it is not always necessary that the columnar conductors 5a and 5b be displaced from the substrate electrodes 4a.

It is not always necessary that a solder bump 9 be formed on the end surface at the other end of each of the columnar conductors 5a through 5e which is connected to a motherboard.

INDUSTRIAL APPLICABILITY

The present disclosure may be applicable to various modules in which external-connection columnar conductors connected to a wiring substrate are sealed with resin.

REFERENCE SIGNS LIST 1, 1a module
2 wiring substrate 3a, 3b component
4a substrate electrode
5a to 5e columnar conductor
6 intermediate coating
7a first sealing resin layer (sealing resin layer)

The invention claimed is:

1. A module comprising:
a wiring substrate that mounts a component thereon;
a substrate electrode that is located on one main surface of the wiring substrate;
a columnar conductor that is connected at one end to the substrate electrode;
an intermediate coating that covers an outer peripheral surface of the columnar conductor; and
a sealing resin layer that covers one main surface of the wiring substrate and the intermediate coating,
wherein the intermediate coating has a coefficient of linear expansion which is between a coefficient of linear expansion of the columnar conductor and a coefficient of linear expansion of the sealing resin layer.

2. The module according to claim 1, wherein the columnar conductor is located such that a center point of a connecting surface of the columnar conductor which is connected to the substrate electrode is displaced in a predetermined direction from a center point of a connecting surface of the substrate electrode which is connected to the columnar conductor.

3. The module according to claim 2, wherein, in a case in which a coefficient of linear expansion of a motherboard to which the other end of the columnar conductor is connected is greater than the coefficient of linear expansion of the sealing resin layer, the predetermined direction is a direction toward a center of the one main surface of the wiring substrate.

4. The module according to claim 2, wherein, in a case in which a coefficient of linear expansion of a motherboard to which the other end of the columnar conductor is connected is smaller than the coefficient of linear expansion of the sealing resin layer, the predetermined direction is a direction toward a peripheral edge of the one main surface of the wiring substrate.

5. The module according to claim 1, wherein the intermediate coating comprises a metal.

6. The module according to claim 1, wherein the intermediate coating covers a portion of a connecting surface of the substrate electrode which is not in contact with the columnar conductor.

7. The module according to claim 1, wherein an area of the connecting surface of the substrate electrode is substantially the same as an area of the one end of the columnar conductor which is connected to and opposes the substrate electrode.

8. The module according to claim 1, wherein the columnar conductor has a step portion in a longitudinal direction of the columnar conductor.

9. The module according to claim 1, wherein a cross sectional area of the one end of the columnar conductor which is connected to the substrate electrode is greater than a cross sectional area of the other end of the columnar conductor.

10. The module according to claim 2, wherein the intermediate coating comprises a metal.

11. The module according to claim 3, wherein the intermediate coating comprises a metal.

12. The module according to claim 4, wherein the intermediate coating comprises a metal.

13. The module according to claim 2, wherein the intermediate coating covers a portion of a connecting surface of the substrate electrode which is not in contact with the columnar conductor.

14. The module according to claim 3, wherein the intermediate coating covers a portion of a connecting surface of the substrate electrode which is not in contact with the columnar conductor.

15. The module according to claim 4, wherein the intermediate coating covers a portion of a connecting surface of the substrate electrode which is not in contact with the columnar conductor.

16. The module according to claim 5, wherein the intermediate coating covers a portion of a connecting surface of the substrate electrode which is not in contact with the columnar conductor.

17. The module according to claim 2, wherein an area of the connecting surface of the substrate electrode is substantially the same as an area of the one end of the columnar conductor which is connected to and opposes the substrate electrode.

18. The module according to claim 3, wherein an area of the connecting surface of the substrate electrode is substantially the same as an area of the one end of the columnar conductor which is connected to and opposes the substrate electrode.

19. The module according to claim 4, wherein an area of the connecting surface of the substrate electrode is substantially the same as an area of the one end of the columnar conductor which is connected to and opposes the substrate electrode.

20. The module according to claim 5, wherein an area of the connecting surface of the substrate electrode is substantially the same as an area of the one end of the columnar conductor which is connected to and opposes the substrate electrode.

21. The module according to claim 1, wherein the columnar conductor is connected at only one end to the substrate electrode.

22. The module according to claim 1, wherein the intermediate coating is formed of a conductive material.

* * * * *